US011277101B2

(12) United States Patent
Gao et al.

(10) Patent No.: US 11,277,101 B2
(45) Date of Patent: Mar. 15, 2022

(54) CURRENT-TO-VOLTAGE SIGNAL CONVERTER

(71) Applicant: Analog Devices International Unlimited Company, Limerick (IE)

(72) Inventors: Jun Gao, Beijing (CN); Tony Liu, Beijing (CN); Sharad Vijaykumar, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/811,602

(22) Filed: Mar. 6, 2020

(65) Prior Publication Data
US 2021/0281222 A1 Sep. 9, 2021

(51) Int. Cl.
  *H03F 1/26* (2006.01)
  *H03F 3/45* (2006.01)
  *H03F 1/02* (2006.01)

(52) U.S. Cl.
  CPC ............ *H03F 1/26* (2013.01); *H03F 3/45* (2013.01)

(58) Field of Classification Search
  CPC ........ H03F 1/26; H03F 3/45; H03F 2200/261; H03F 2200/516; H03F 2203/45074; H03F 3/45475; H03F 2203/45066; H03F 2203/45138; H03F 3/087
  USPC ......................................... 330/308, 10, 310
  See application file for complete search history.

(56) References Cited

U.S. PATENT DOCUMENTS

| 5,682,028 A * | 10/1997 | Coleman ............ G06K 7/10851 235/454 |
| 6,552,605 B1 | 4/2003 | Yoon |
| 6,583,670 B2 | 6/2003 | Wang |
| 6,760,552 B1 * | 7/2004 | Tajima ............... H04B 10/6931 398/158 |
| 7,453,322 B2 | 11/2008 | Li et al. |
| 9,654,061 B2 | 5/2017 | Lakshmikumar et al. |
| 9,780,743 B2 * | 10/2017 | Aina .................. H03F 3/45928 |
| 10,141,889 B2 * | 11/2018 | Ogomi ............... H03F 3/45076 |

FOREIGN PATENT DOCUMENTS

| CN | 101556296 | 12/2010 |
| WO | 2009055035 | 4/2009 |
| WO | 2013165381 | 11/2013 |

* cited by examiner

*Primary Examiner* — Hieu P Nguyen
(74) *Attorney, Agent, or Firm* — Schwegman Lundberg & Woessner, P.A.

(57) ABSTRACT

The present disclosure provides a current-to-voltage signal converter which may operate at an adjusted voltage. The current-to-voltage converter includes a trans-impedance amplifier which converts a current input into a voltage output. The voltage output may operate around an undesirable predetermined voltage, and must therefore be adjusted in order to make it suitable for any downstream signal processing circuitry, such as an ADC. As such, a subtractor circuit is coupled to the output of the trans-impedance amplifier. At the input of the subtractor circuit, a voltage adjustment circuit is employed, to adjust the voltage input to the subtractor circuit. As such, the input to the subtractor is adjusted between a first predetermined voltage threshold and a second predetermined voltage threshold, and the subtractor circuit may therefore be a low-voltage component.

18 Claims, 7 Drawing Sheets

CURRENT-TO-VOLTAGE SIGNAL CONVERTER

FIELD OF THE DISCLOSURE

The present disclosure relates to current-to-voltage signal converters. In particular, it relates to a circuit in which the operational voltage may be adjusted, such that low-voltage components may be used.

BACKGROUND

In many applications it is necessary to convert current signals into voltage signals. A way to do this is with a trans-impedance amplifier.

Within the technical field of optical sensing it a trans-impedance amplifier can convert an output current from an optical photodiode to a voltage signal ready to be converted by an analog-to-digital converter (ADC). For some applications the output voltage range from a trans-impedance amplifier is further conditioned to make it suitable for being converted by an ADC. For example, by making the dynamic range of the signal match the dynamic range of the ADC.

Optical photodiodes are often biased with a voltage reference and the output current signal of the optical photodiode will be dependent on the voltage reference used. Therefore, it is possible to directly adjust the voltage reference in order to bias the output current signal. However, this can result in excess components and can often impact upon the accuracy of the representation of the original optical signal if the voltage reference is not accounted for.

SUMMARY OF THE DISCLOSURE

The present disclosure provides a current-to-voltage signal converter which may operate at a reduced voltage. The current-to-voltage converter includes a trans-impedance amplifier which converts a current input into a voltage output. The voltage output may operate above a first predetermined voltage or below a second predetermined voltage (where the first predetermined voltage is greater than the second predetermined voltage), and must therefore be adjusted in order to make it suitable for any downstream signal processing circuitry, such as an ADC. As such, a subtractor circuit is coupled to the output of the trans-impedance amplifier. At the input of the subtractor circuit, a voltage adjustment circuit is employed, to adjust the voltage input to the subtractor circuit. As such, the input to the subtractor is adjusted between a first predetermined voltage threshold and a second predetermined voltage threshold, and the subtractor circuit may therefore be a low-voltage component.

According to a first aspect there is provided a current-to-voltage signal converter, comprising: a first stage, configured to convert an input current signal to a first voltage signal; an analog subtractor circuit comprising an amplifier, wherein the analog subtractor circuit is electrically coupled to the first stage to convert the first voltage signal into a second voltage signal; and, a voltage adjustment arrangement, coupled to at least one input of the amplifier, and configured such that the voltage at the at least one input of the amplifier is between a first predetermined voltage threshold and a second predetermined voltage threshold.

The voltage adjustment arrangement can allow for an improvement is system cost (reduced component size, power) and an improved system performance. This can allow the amplifier to be a low voltage amplifier and/or a unipolar amplifier which can lead to further advantages.

A low voltage amplifier operates with a lower supply voltage than an amplifier. This is a relative concept which, for an integrated circuit (IC), depends on the foundry process. In a foundry process, it is possible to select different voltage ranges and some are lower, some are higher. An IC can comprise many different discrete voltage levels e.g. 20V, 10V, 5V, 3.3V, 1.8V, 1.3V, etc. To differentiate the two types of amplifiers, an amplifier in an IC can operate with a supply voltage which can be the highest voltage level supported by that IC. A low voltage amplifier in an IC can operate with a supply voltage lower than the highest voltage level supported by that IC, For example, on one IC the highest voltage level supported may be 10V, therefore a low voltage amplifier may operate with a supply voltage of 5V. In another example, on one IC the highest voltage level supported may be 5V, therefore a low voltage amplifier may operate with a supply voltage of 1.8V.

This can lead to accuracy and power advantages for the low voltage amplifier. Thus, a low voltage amplifier can operate at (or have a supply voltage) an IC supported voltage level less than the maximum voltage level supported. Alternatively, a low voltage amplifier can operate at (or have a supply voltage) the lowest voltage level supported by an IC.

Similarly, an amplifier may operate with an asymmetrical supply voltage, such that the positive supply voltage can be the highest voltage level supported by that IC and a negative supply voltage which can be 0V. The reduced dynamic range of this amplifier supplied by an asymmetrical supply voltage may also lead to accuracy and power advantages.

It is also possible to arrange the voltage adjustment arrangement to bias the voltage level so that the inputs to the amplifier is a positive voltage value. This allows the amplifier to be supplied by a unipolar supply voltage i.e. the negative voltage rail is set to electrical ground. This enables the system to operate with greater power efficiency.

Thus the amplifier may be a low voltage amplifier and/or supplied by a unipolar supply voltage. This can improve system performance (accuracy, power efficiency) and reduce cost of the system (reduced surface area and size).

The voltage adjustment arrangement can comprise a first reference source, coupled to the at least one input of the amplifier.

The at least one input of the amplifier can comprise a first input and a second input. The first reference source can be coupled to both the first input and the second input, and can be a common mode reference.

The common mode reference can be a voltage or current source.

The first predetermined voltage threshold is greater than the second predetermined voltage threshold, wherein the first voltage signal is at least partially above the first predetermined voltage threshold or at least partially below the second predetermined voltage threshold.

The amplifier can be a low voltage amplifier and can operate in its linear region. The amplifier can have a predetermined input voltage range, and the first predetermined voltage threshold can be less than or equal to the upper end of the predetermined input voltage range, and the second predetermined voltage threshold is greater than or equal to the lower end of the predetermined input voltage range. The first and second predetermined voltage thresholds may be substantially equal to the positive and negative supply voltage of amplifier divided by the gain of the amplifier, respectively.

The first stage can be configured to operate within a first supply voltage range. The amplifier can be an operational amplifier and can be configured to operate within a second supply voltage range. The first supply voltage range can be greater than the second supply voltage range. The amplifier can be configured to be further powered by a unipolar supply voltage. The positive and negative supply voltage of the amplifier can be different from the positive and negative supply voltage of the first stage. The dynamic range of the amplifier can be less than the dynamic range of the first stage. The voltage range between the positive and negative supply voltage of the amplifier is less than the voltage range between the positive and negative supply voltage of the first stage.

The input current signal can be generated by a photodiode biased by a first reference voltage. The first stage can be a trans-impedance amplifier comprising a voltage input and a current input. The first reference voltage can be electrically coupled to the voltage input and the input current signal can be electrically coupled to the current input. The second voltage signal can be suitable for supplying an Analog to Digital Converter.

The analog subtractor circuit can further comprise a first, second, third and fourth resistors. The first resistor can be electrically coupled in series between the first input and the first voltage signal. The second resistor can be electrically coupled to the first input and forms a negative feedback loop based on the output of the operational amplifier. The output of the operational amplifier can be the second voltage signal. The third resistor and the fourth resistor can form a potential divider such that the third resistor can be electrically coupled in series between the second input and the first reference voltage, and the fourth resistor can be electrically coupled to a ground state. The first and third resistors can have substantially the same value resistance and the second and fourth resistors can have substantially the same value resistance.

The common mode reference can comprise a/the fixed voltage source electrically coupled to a first terminal of a first common mode resistor and a first terminal of a second common mode resistor. The second terminals of the first and second common mode resistors can be electrically coupled to the first and second inputs respectively. The first and second common mode resistors can have substantially the same value resistance.

The first reference voltage can have a predetermined value, and the common mode reference is a fixed voltage source can have a predetermined voltage based on the predetermined value.

The voltage adjustment arrangement can comprise a feedback loop configured to adjust the voltage of both the first input and second input into the amplifier of the analog subtractor circuit. The voltage adjustment arrangement can comprise a feedback amplifier configured to receive the second input to the amplifier of the analog subtractor circuit.

The feedback amplifier can be an NMOS transistor. The voltage of both the first input and the second input into the amplifier of the analog subtractor circuit can correspond to at least the threshold voltage of the NMOS transistor.

The feedback amplifier can be electrically coupled to a first terminal of a first common mode resistor and to a first terminal of a second common mode resistor. The second terminals of first and second common mode resistors can be electrically coupled to the first and second input respectively. The first and second common mode resistors can have substantially the same value resistance.

The feedback amplifier can be configured to operate a current mirror arrangement comprising two mirrored transistors and a control transistor. The feedback amplifier can be arranged to control the current flow in the control transistor and the two mirrored transistors can be electrically coupled to the first and second input respectively. The two mirrored transistors can be size matched.

The first stage can include a first reference voltage. The first voltage signal can be dependent on the first voltage reference. The second voltage signal can be independent of the first voltage reference.

According to a second aspect there is provided a transimpedance amplifier, comprising: a current-to-voltage converter, configured to receive a first current signal, and to generate a positive voltage output; a voltage adjustment arrangement, coupled to the current-to-voltage converter, and configured to enable at least part of the current-to-voltage converter to between a first predetermined voltage threshold and a second predetermined voltage threshold. The voltage adjustment arrangement can comprise a constant voltage/current source coupled to a first terminal of a resistor. A second terminal of the resistor can be coupled to the current-to-voltage converter.

The voltage adjustment arrangement can comprise a feedback amplifier arranged to actively control the reduction in voltage based on the positive voltage output.

According to a third aspect there is provided a method of converting a current signal to a voltage signal, the method comprising: converting an input current signal to a first voltage signal using a first stage of a signal converter; converting the first voltage signal into a second voltage signal using an analog subtractor circuit comprising an amplifier; and, applying a voltage adjustment arrangement to at least one input of the amplifier to reduce the voltage at the at least one input to the amplifier between a first predetermined voltage threshold and a second predetermined voltage threshold.

The at least one input of the amplifier can comprise a first input and a second input. The voltage adjustment arrangement can comprise a common mode reference coupled to both the first input and the second input. The common mode reference can be a DC source.

The method can further include performing the step of predetermining a DC offset voltage of the first voltage signal. The method can further performing the step of predetermining a voltage or current value of the DC source based on the predetermined DC offset voltage.

The method can further include performing the step of adjusting a voltage or current value at both the first input and the second input based on a DC offset voltage of the first voltage signal.

The method can further include performing the step of receiving the input current signal from a photodiode. The method can further performing the step of applying the second voltage signal to an Analog to Digital Converter.

DESCRIPTION OF THE FIGURES

The present disclosure will now be described, by way of example only, in conjunction with the attached drawings, in which.

DETAILED DESCRIPTION

Certain circuit components produce an output in which the signal is a varying current, as opposed to a varying voltage. For example, photodiodes produce a current-based output signal. Signal processing circuits, which are used to condition analog signals, for example by converting them to digital signals, typically require voltage-based signals, within a particular voltage range. As such, it is necessary to convert current-based signals to voltage-based signals, such that they can be processed. This is typically done by a transimpedance amplifier, as noted above. However, the output of a transimpedance amplifier is normally outside of the range of suitable inputs for downstream signal processing components, such as an analog-to-digital converter. As such, a subtractor circuit is used, to adjust the voltage of the output signal. Owing to the voltages typical involved, absent any further conditioning, the subtractor circuit would need to be a high-voltage component.

The present disclosure introduces a voltage adjustment mechanism, at the input to the amplifier of the subtractor circuit. For example, a common mode voltage may be coupled to both the inverting and non-inverting inputs of the amplifier, via a pair of resistors. As such, the voltage at the input to the subtractor amplifier may be adjusted between a first predetermined voltage threshold and a second predetermined voltage threshold, and the subtractor may then be made from low voltage components. This may reduce the area required by the subtractor, and the cost of the circuit.

Figure 1:
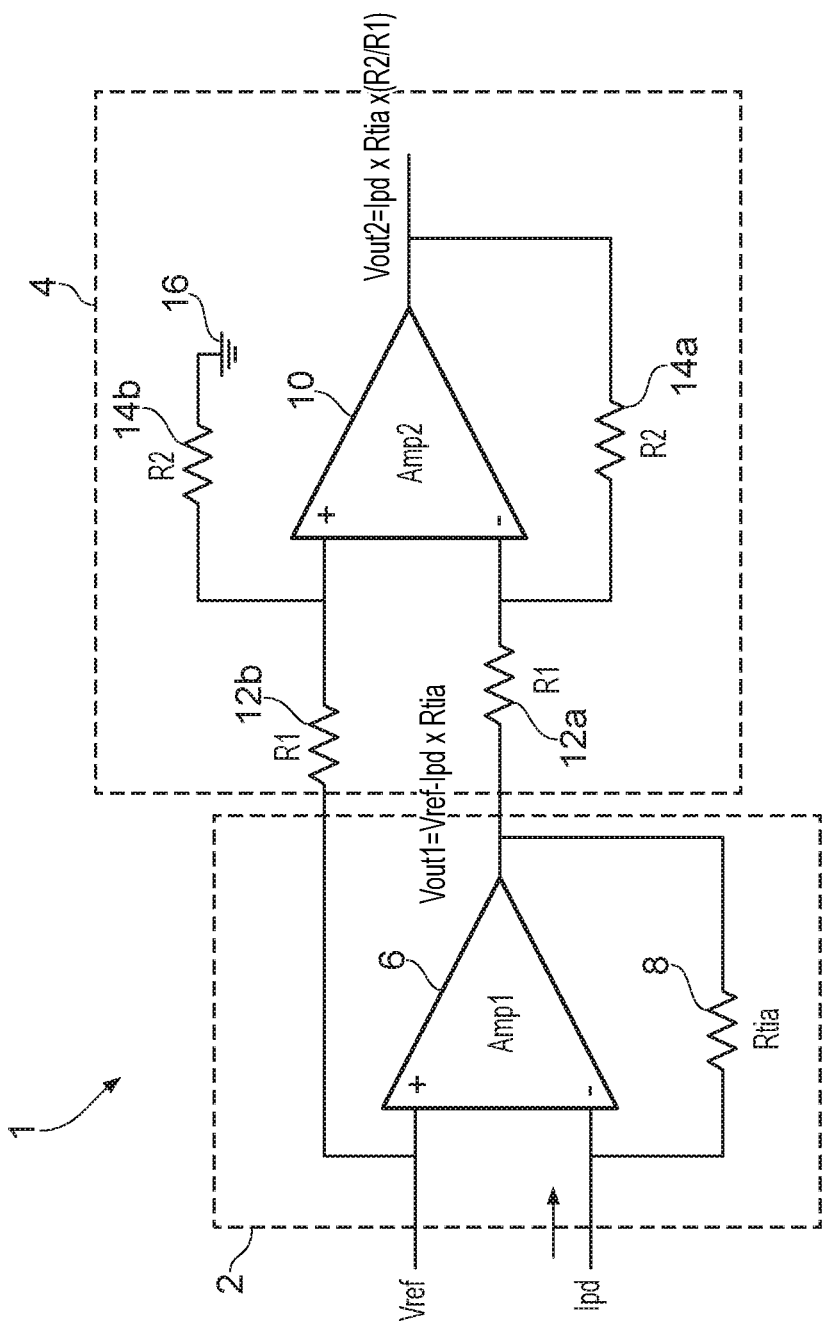
FIG. 1 illustrates a circuit diagram of a current-to-voltage signal converter.

FIG. 1 illustrates a current-to-voltage signal converter 1. The input to the current-to-voltage signal converter 1 is an input current signal (Ipd). Ipd can be the output of a photodiode which is biased by a first reference voltage (Vref). Vref may be any voltage from a high positive voltage to a high negative voltage depending on the characteristics of the photodiode. The output (Vout2) of the current-to-voltage signal converter 1 is intended to be suitable for receipt by an analog-to-digital converter (ADC), such that the optical signal incident onto the photodiode can be accurately interpreted by a digital processing device.

The current-to-voltage signal converter 1 is comprised of two stages: a trans-impedance amplifier 2; and, an analog subtractor circuit 4. The current-to-voltage signal converter 1 may be understood as a trans-impedance amplifier itself since it performs the overall function of receiving an input current signal and outputting an output voltage signal which can be suitable for receipt by an ADC.

The trans-impedance amplifier 2 comprises a first operational amplifier (op-amp) 6 with a trans-impedance feedback resistor (Rtia) 8 coupled between the output and the inverting input of the first op-amp 6. The input current signal (Ipd) is coupled to the inverting input of the first op-amp 6. The first reference voltage (Vref) is coupled to the non-inverting input of the first op-amp 6. The output of the trans-impedance amplifier 2 is a first voltage signal (Vout1):

$$Vout1 = Vref - (Ipd * Rtia) \qquad (1)$$

The analog subtractor circuit 4 is electrically coupled to the trans-impedance amplifier 2 to convert the first voltage signal (Vout1) into a second voltage signal (Vout2). The analog subtractor circuit 4 comprises a second op-amp 10 and four resistors 12a, 12b, 14a, 14b. The first resistor 12a is electrically coupled in series between the inverting input of the second op-amp 10 and the first voltage signal (Vout1). The second resistor 14a is electrically coupled to the output and the inverting input of the second op-amp 10 to form a negative feedback loop based on the output of the second op-amp 10. The third resistor 12b and the fourth resistor 14b form a potential divider circuit. The third resistor 12b is electrically coupled in series between the non-inverting input of the second op-amp 10 and the first reference voltage (Vref), and the fourth resistor 14b is electrically coupled to the non-inverting input of the second op-amp 10 and electrical ground 16. The first resistor 12a and third resistor 12b are selected to have substantially the same value resistance (R1). The second resistor 14a and fourth resistor 14b are selected to have substantially the same value resistance (R2), The resistance values of the four resistors 12a, 12b, 14a, 14b are selected so that the second voltage signal (Vout2) is independent of the first reference voltage (Vref). However, selecting resistance values R1 and R2 simplifies the overall circuit design and may lead to reduced circuit cost (manufacturing time, materials, etc.).

The second voltage signal (Vout2) is the output of the analog subtractor circuit 4:

$$Vout2 = (Ipd * Rtia) * \frac{R2}{R1} \qquad (2)$$

The analog subtractor circuit 4 can be seen as acting as an analog voltage shifter. Generally, the first output signal (Vout1) has a voltage range from Vref to Vref-Vin, and the second output signal (Vout2) has a voltage range from 0 to Vin. Where Vin represents the signal of interest (Ipd) from the input (e.g. from the photodiode) and is Ipd*Rtia. This is a voltage shift of −Vref. However, if Vref is a high voltage signal, then the second op-amp 10 must be rated as a high voltage amplifier because the input of the second op-amp 10 'sees' a high voltage signal, i.e. there is a high voltage signal incident upon the inputs of the second op-amp 10. The voltage signal received by the second op-amp 10 may also be a negative voltage depending on the values of Vref and Vin. The analog subtractor circuit 4 can also be used to amplify Vin, if necessary.

In Integrated circuit (IC) design, high voltage devices generally have a large physical footprint (e.g. 4-5 times larger than a low voltage amplifier). They are comparatively very large devices, and have poor performance in comparison to other lower voltage IC components. This leads to a high overall system cost with performance limitations.

Since Vref and Vin can vary in time (i.e. time variant signals), they can both have associated analog voltage ranges. A circuit which can accept a large analog voltage range and can reduce the analog voltage range to a suitable range for low voltage devices, can allow downstream components to be low voltage devices. Such a circuit can reduce the material and performance cost of downstream components and also reduce associated design efforts.

Figure 2:
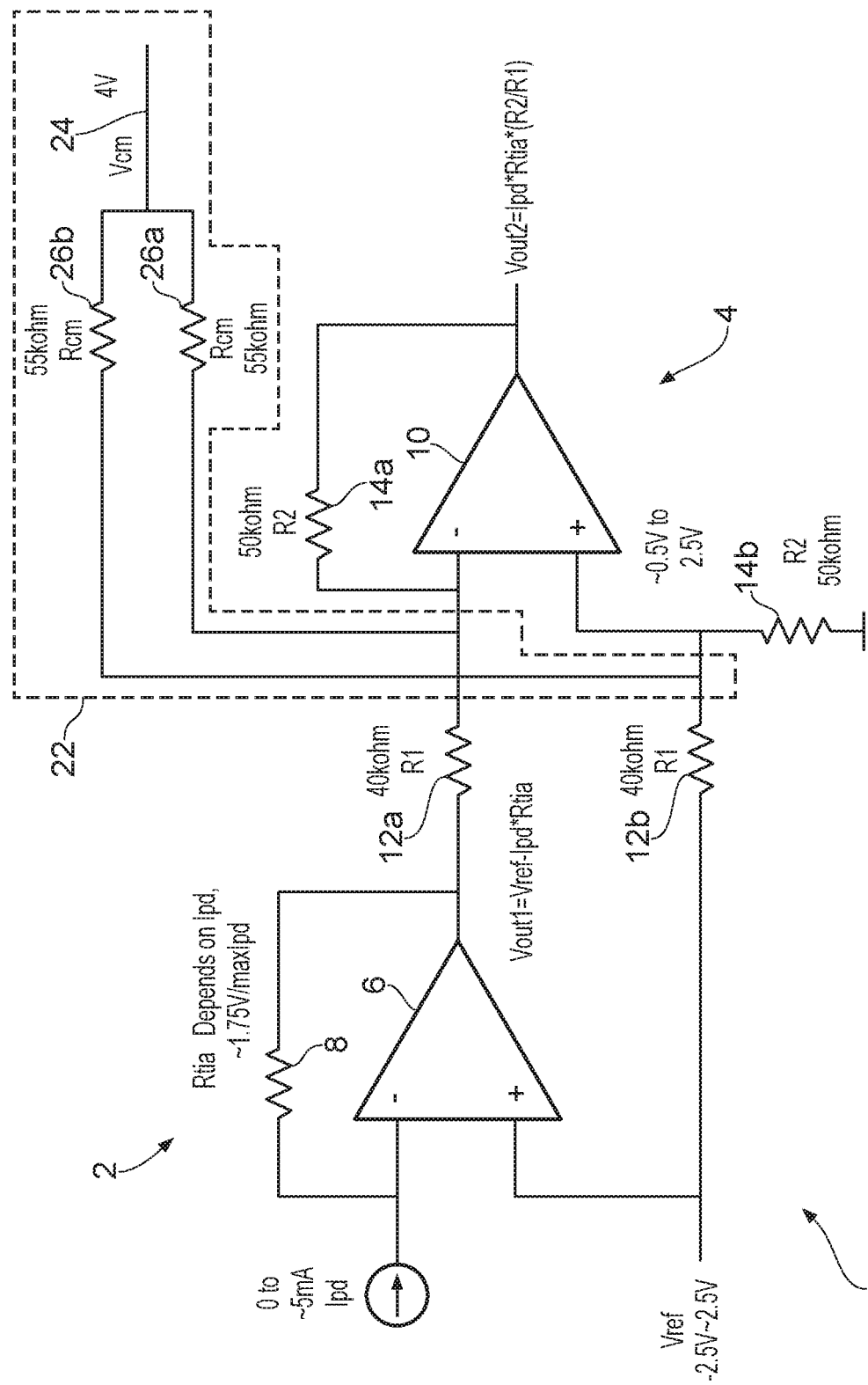
FIG. 2 illustrates a circuit diagram of a current-to-voltage signal converter with a voltage adjustment arrangement.

FIG. 2 illustrates a current-to-voltage signal converter 20 which has the same structure as the current-to-voltage signal converter 1 illustrated in FIG. 1 (i.e. a trans-impedance amplifier 2 and an analog subtractor circuit 4) with the addition of a voltage adjustment arrangement 22.

The voltage adjustment arrangement 22 comprises a common mode voltage source 24, coupled to the inverting and non-inverting inputs of the second op-amp 10 via a first common mode resistor 26a and a second common mode resistor 26b. By using a common mode voltage source, the voltage is applied equally to the inverting and non-inverting inputs of the second op-amp 10. The common mode voltage source 24 is a fixed voltage source (Vcm).

As shown in FIG. 2, the common mode voltage source 24 (Vcm) is electrically coupled to a first terminal of the first common mode resistor 26a and a first terminal of a second common mode resistor 26b. The second terminals of the first common mode resistor 26a and second common mode resistors 26b are electrically coupled to the inverting and non-inverting inputs of the second op-amp 10 respectively. The first and second common mode resistors 26a, 26b have substantially the same resistance value Rcm. This is because resistors 12a and 12b have substantially the same resistance value R1 and resistors 14a and 14b have substantially the same resistance value R2. That is to say that the resistor values are chosen so to eliminate Vref from the output signal i.e. any resistor values could be chosen for the resistors 12a, 12b, 14a, 14b, 26a, and 26b, as long as the second voltage signal (Vout2) is independent of the first reference voltage (Vref).

Example values are as follows: the input current signal may range from around 0 to 5 mA; the first reference voltage (Vref) may range from around −2.5V to 2.5V; the trans-impedance feedback resistor 8 (Rtia) depends on Ipd, however, it may be around 1.75V divided-by the maximum Ipd value (in amperes); the resistors 12a, 12b may be around 40K ohm; the resistors 14a, 14b may be around 50K ohm; the resistors 26a, 26b may be around 55K ohm; the voltage at the non-inverting and inverting input of the second op-amp 10 may range from around 0.5V to 2.5V; and, the common mode voltage source 24 may be around 4V. These values may be changed depending on the application and/or designer choice. Moreover, it will be apparent that it is the ratio of the values of R1:R2:Rcm which may result in the voltage range of the desired output (Vout2).

The voltage adjustment arrangement 22 is arranged to bias the voltage level at the inverting and non-inverting inputs into the second op-amp 10 so that the analog voltage range that is 'seen' by the inputs to the second op-amp 10 is between a first predetermined voltage threshold and a second predetermined voltage threshold. By adjusting the inputs to the second op-amp 10 to between a first predetermined voltage threshold and a second predetermined voltage threshold, the same overall system performance can be maintained and even improved if the second op-amp 10 is a low voltage op-amp.

As explained above, by using a low voltage op-amp, an improvement in system cost (i.e. reduced size, power) can be achieved with an improvement in system performance. If the second op-amp 10 is a low voltage op-amp then for correct operation of the analog subtractor circuit 4, the second op-amp will be operating in its linear region. Therefore, voltage adjustment arrangement 22 may be set so that the second op-amp 10 does not to amplify the input signal voltage to beyond its supply voltage, thus causing the input signal to saturate (i.e. the op-amp operating in its saturation region). Even with the addition of extra circuit component such as the voltage adjustment arrangement 22, by using a low voltage op-amp, then power, size, cost can all be reduced in comparison of the circuit illustrated in FIG. 1.

It is possible for Vout1 to be negative as described previously based the value of Vref and Vin (Ipd*Rtia). It is also possible to arrange the voltage adjustment arrangement 22 to bias the voltage level so that the inputs to the second op-amp 10 is a positive voltage value. This allows the second op-amp 10 to be supplied by a unipolar supply voltage i.e. the negative voltage rail is set to electrical ground. This enables the system to operate with greater power efficiency. In practice, if the second op-amp 10 is supplied by a unipolar supply then the negative supply voltage will be 0V and the positive supply voltage can be the same as the positive supply voltage for the first op-amp 6. Therefore, the second op-amp 10 will have half of the supply voltage range as the first op-amp 6 if the first op-amp 6 has a negative supply voltage of the same magnitude as the positive supply voltage. Thus, the second op-amp 10 can be a low voltage amp.

Thus the second op-amp 10 may be a low voltage op-amp and/or supplied by a unipolar supply voltage. This can improve system performance (accuracy, power efficiency) and reduce cost of the system (reduced surface area and size).

The voltage value of the common mode voltage source 24 (Vcm) is a fixed voltage source having a predetermined voltage. This is determined based on a predetermined value of the first reference voltage (Vref). The first reference voltage (Vref) may not be a stable voltage source and therefore may fluctuate during operation. However, if the fluctuations of the first reference voltage (Vref) are relatively small (i.e. a small Vref voltage range), then the pair of common mode resistors 26a, 26b coupled to Vcm can be used. This can reduce the design complicity but cannot handle a very large voltage range of Vref. Thus, the second op-amp 10 has a predetermined input voltage range which if exceeded may begin to saturate the first voltage signal (Vout1). The predetermined voltage threshold is therefore less than or equal to the upper end of the predetermined input voltage range.

The first op-amp 6 can be a high voltage op-amp and the second op-amp 10 can be a low voltage op-amp. The first stage (i.e. the trans-impedance amplifier 2) can be configured to operate within a first supply voltage range. The second op-amp 10 can be configured to operate within a second supply voltage range. The first supply voltage range can be greater than the second supply voltage range. Generally op-amps such as the first op-amp 6 and the second op-amp 10 have two supply voltage contacts: a positive supply voltage contact and a negative supply voltage contact. The negative supply voltage contact may be 0V, or any voltage less than the positive supply voltage. Similarly, the positive supply voltage contact may be 0V, or any voltage greater than the negative supply voltage.

Figure 4:
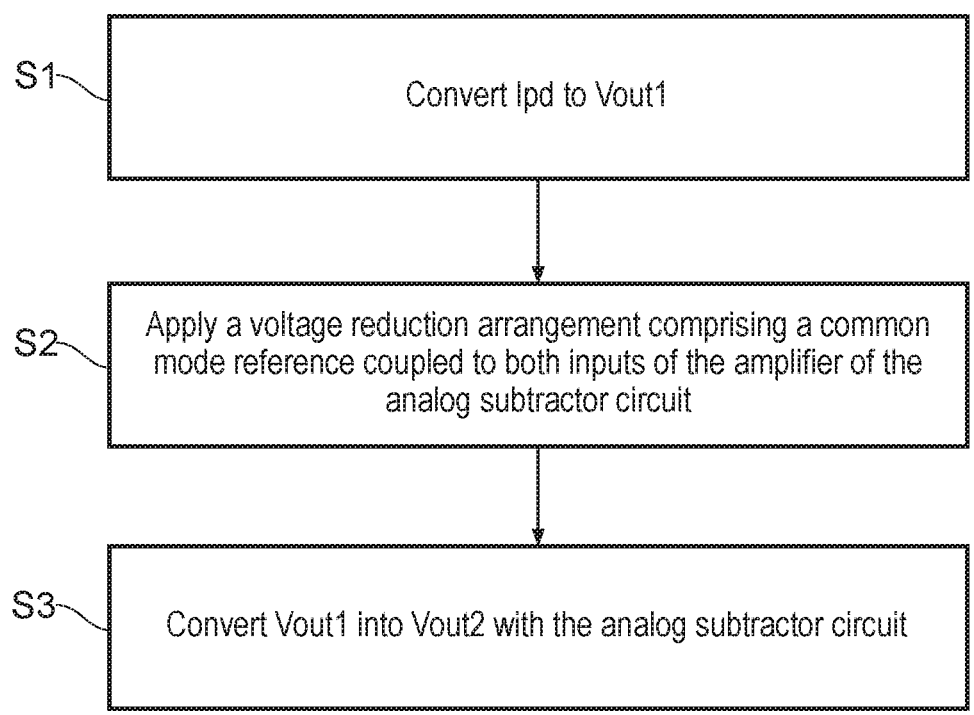
FIG. 4 illustrates a flow diagram of the method of converting a current signal to a voltage signal with a voltage adjustment arrangement.

The current-to-voltage signal converter 20 performs the method of converting a current signal to a voltage signal, as shown in the flow diagram of FIG. 4. The method can comprise at least the following three steps:

S1. Converting an input current signal (Ipd) to a first voltage signal (Vout1) using the first stage 2 of the signal converter 20.

S2. Applying a voltage adjustment arrangement 22. The voltage adjustment arrangement 22 comprises a common mode reference (e.g. common mode voltage source 24 which can be DC source 24) coupled to both inputs (e.g. inverting and non-inverting inputs) of the amplifier 10 of the analog subtractor circuit 4. The voltage adjustment arrangement 22 to adjusts the voltage at the at least one input to the amplifier 10 between a first predetermined voltage threshold and a second predetermined voltage threshold.

S3. Converting the first voltage signal (Vout1) into a second voltage signal (Vout2) using the analog subtractor circuit 4 comprising an amplifier 10 with a first and second input.

In absence of the voltage adjustment arrangement, the first voltage signal (Vout1) may have a DC offset (Vref) which can cause the first voltage signal to vary over a large voltage range. This necessitates that the amplifier 10 be a high voltage device in order to accurately subtract the DC offset (Vref) from the desired signal (i.e. Ipd*Rtia).

The voltage adjustment arrangement 22 can eliminate the requirement that the amplifier 10 be a high voltage device by applying an adjusting voltage to the at least one input to the amplifier 10. This can shift and/or scale the DC offset (Vref), therefore the input range to the amplifier 10 is adjusted. Therefore, the amplifier 10 can be a low voltage amplifier and/or a unipolar amplifier. This can improve performance and cost (materials) of the overall current-to-voltage signal converter 20.

The method can comprise the additional step of predetermining the DC offset voltage (Vref) of the first voltage signal (Vout1) and predetermining a voltage (or current value) of the DC source 24 based on the predetermined DC offset voltage (Vref). Depending on the tolerances of the amplifier 10 (e.g. low voltage amplifier or otherwise) and the voltage range of the desired voltage signal (i.e. Ipd*Rtia), it can be possible to fix the value of the DC source 24 to a fixed voltage. This can reduce circuit complexity.

However, the predetermination of the value of the DC source 24 can be further based on the expected variation in the DC offset (Vref) so that during operation the input to the amplifier 10 does not exceed the first predetermined voltage threshold or fall below the second predetermined voltage threshold. These predetermined voltage thresholds may be the limit at which the amplifier 10 no longer operates in its linear region and begins to operate in its saturation region. Similarly, this is not a strict limit and it may be acceptable depending on the application to exceed this limit a percentage of the time, such that for the majority of time the second voltage signal (Vout2) is representative/linearly proportional to the input current signal (Ipd).

Figure 3:
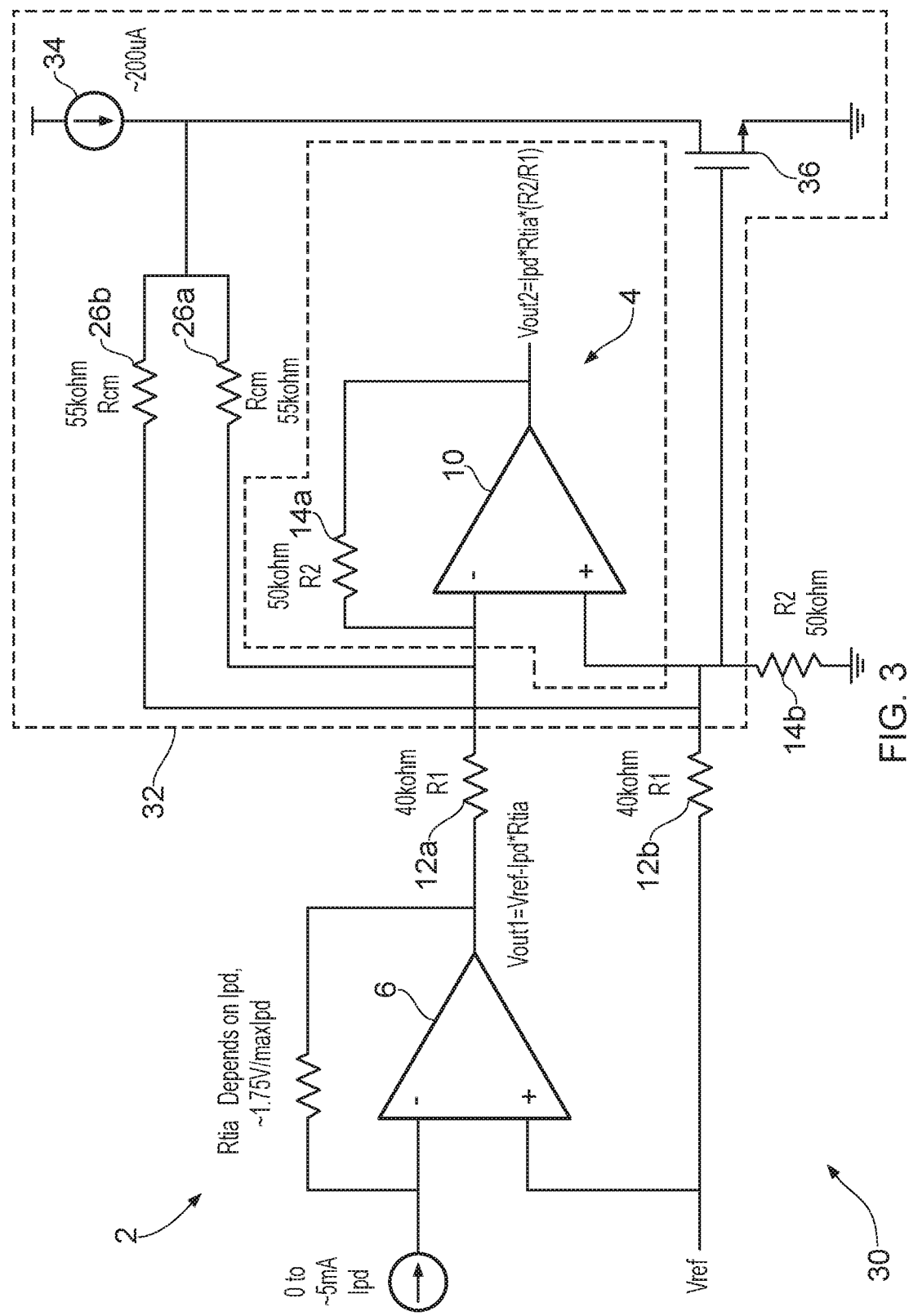
FIG. 3 illustrates a circuit diagram of a current-to-voltage signal converter with a feedback voltage adjustment arrangement with an NMOS transistor.

FIG. 3 illustrates a current-to-voltage signal converter 30 comprising the structure of the current-to-voltage signal converter 1 (i.e. a trans-impedance amplifier 2 and an analog subtractor circuit 4) as illustrated in FIG. 1 with the addition of a voltage adjustment arrangement 32.

The current-to-voltage signal converter 30 operates in much the same way as the current-to-voltage converter 20 of FIG. 2 with all of the same advantages. However, the current-to-voltage converter 30 of FIG. 3 can further operate even when the first reference voltage (Vref) has a large and unknown voltage range/voltage fluctuations, by virtue of a feedback loop of the voltage adjustment arrangement 32. The voltage adjustment arrangement 32 comprises a feedback amplifier 36 arranged to actively control the adjustment in voltage based on the positive voltage output.

The voltage adjustment arrangement 32 reacts to variations in the first reference voltage (Vref) and can further voltage shift the first reference voltage (Vref) to ensure that the voltage at the non-inverting terminal of the second op-amp 10 remains substantially consistent. In addition, any fluctuations in the first reference voltage (Vref) can be reproduced at the inverting input of the second op-amp 10 (similar to the non-inverting input of the second op-amp 10) so that the second op-amp 10 can effectively subtract the first reference voltage (Vref) from the first voltage signal (i.e. Vout1).

The voltage adjustment arrangement 32 comprises a first reference source which is a common mode current source 34. The common mode current source 34 is electrically coupled to the first terminal of the first common mode resistor 26a and to the first terminal of the second common mode resistor 26b. The second terminals of first and second common mode resistors 26a, 26b are electrically coupled to the inverting and non-inverting inputs of the second op-amp 10 respectively. Similarly to the common mode resistors of FIG. 2, the first and second common mode resistors 26a, 26b may have substantially the same value resistance for the same reasons.

The feedback amplifier can be an NMOS transistor 36, as shown in FIG. 3. The gate of the NMOS transistor 36 is electrically coupled to the non-inverting input of the second op-amp 10. The source of the NMOS transistor 36 is electrically coupled to the ground plane (or electrical ground). The drain of the NMOS transistor 36 is electrically coupled to the common mode current source 34, the first terminal of the first common mode resistor 26a, and to the first terminal of the second common mode resistor 26b.

The transistor 36 in this arrangement can be arranged to adjust its channel until the gate-to-ground voltage is near its threshold voltage (Vth), which can be in the low voltage range. Put another way, the NMOS transistor 36 can ensure that the voltage of both the non-inverting input and the inverting input into the second op-amp 10 of the analog subtractor circuit 4 corresponds to at least the threshold voltage (Vth) of the NMOS transistor 36. The threshold voltage (Vth) can typically be around 0.7V. This results in the common mode of the signal of interest (i.e. Ipd*Rtia) varying around the biased DC voltage signal (i.e. Vth). The selection of Rtia can be predetermined such that the range of the signal can remain in the low voltage range, such that the second op-amp 10 can be a low voltage device. Moreover, the selection of Rcm can be predetermined such that the signal remains above 0V (i.e. electrical ground), such that the second op-amp 10 can further be a unipolar supplied device and possibly a low voltage device.

The current-to-voltage signal converter 30 performs the method of converting a current signal to a voltage signal. The method can comprise at least the three steps described above in reference to the current-to-voltage converter 20.

The current-to-voltage signal converter 30 can further adjust the voltage or current value at both inputs to the amplifier 10 based on the DC offset voltage (Vref) of the first voltage signal (Vout1). The adjustment can be a shifting, scaling, and/or stabilisation of the DC offset voltage (Vref). The value of the voltage or current value at both inputs to the amplifier is based on the actual variation in the DC offset (Vref), via a feedback loop. The feedback loop is configured so that during operation the input to the amplifier 10 does not exceed the first predetermined voltage threshold or fall below the second predetermined voltage threshold. These predetermined voltage thresholds may be the limit at which the amplifier 10 no longer operates in its linear region, and begins to operate in its saturation region. This is not a strict limit and it may be acceptable depending on the application to exceed this limit a percentage of the time, such that for the majority of time the second voltage signal (Vout2) is representative/linearly proportional to the input current signal (Ipd).

Figure 5:
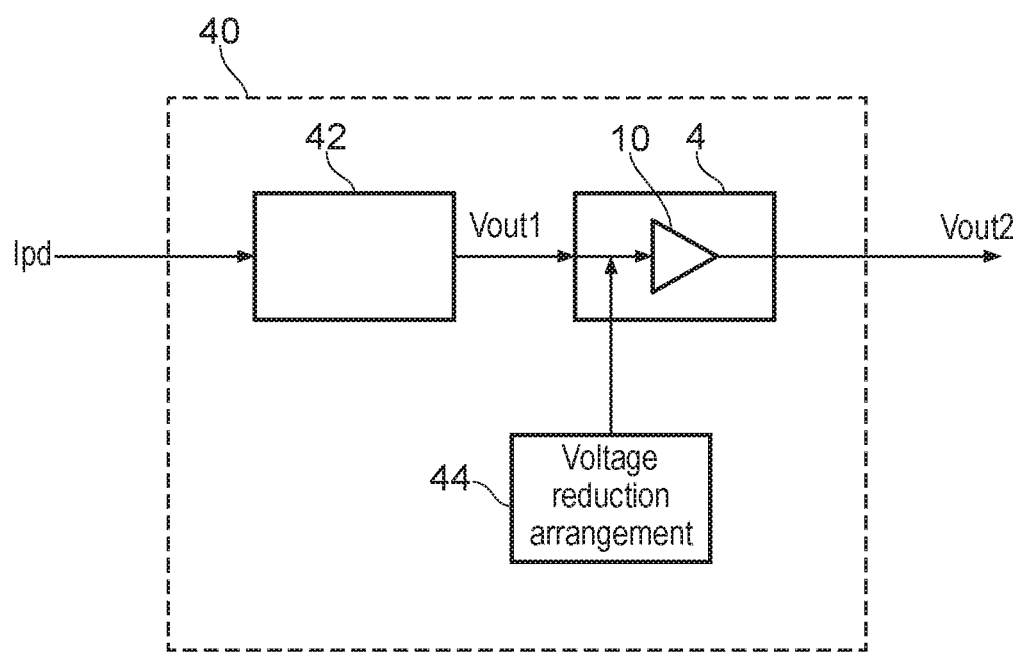
FIG. 5 illustrates a block diagram of a current-to-voltage signal converter with a voltage adjustment arrangement.

FIG. 5 illustrates a block diagram of a current-to-voltage signal converter 40 comprising a first stage 42, an analog subtractor circuit 4, and a voltage adjustment arrangement 44.

The first stage 42 is configured to convert an input current signal (Ipd) to a first voltage signal (Vout1). This can be accomplished in many ways as known in the art, however, a specific example is a trans-impedance amplifier circuit 2 shown in FIGS. 1-3.

The second stage of the current-to-voltage signal converter 40 is the analog subtractor circuit 4. The analog subtractor circuit 4 comprises an amplifier 10. The analog subtractor circuit 4 is electrically coupled to the first stage 42 to convert the first voltage signal (Vout1) into a second voltage signal (Vout2) i.e. it performs at least a voltage shift operation.

The voltage adjustment circuit 44 is electrically coupled to at least one input of the amplifier 10, and configured such that the voltage at the at least one input of the amplifier 10 is between a first predetermined voltage threshold and a second predetermined voltage threshold. The voltage adjustment circuit 44 can be an open loop system, a feedforward system, or a feedback system.

The analog subtractor circuit 4 can further comprise an input for a first reference voltage (Vref). The first voltage signal (Vout1) can comprise a component of the first reference voltage (Vref). For example, the first reference voltage (Vref) may be a (time) varying DC offset. Therefore, the voltage adjustment arrangement 44 can introduce a first reference source to the input of the amplifier 10. This can (partially or fully) scale/offset the first reference voltage (Vref) component of the first voltage signal (Vout1). The voltage adjustment circuit 44 can be designed with pre-defined knowledge of the first reference voltage (Vref) in order to scale/offset it (i.e. an open loop system e.g. FIG. 2), or it can be designed to be reactive to the current/future/past first reference voltage (Vref) in operation (i.e. a closed loop system [feedback or feedforward] e.g. FIG. 3). The voltage adjustment circuit 44 allows for an improvement in system cost (reduced component size, power) and an improved system performance. This can allow the amplifier 10 to be a low voltage amplifier and/or a unipolar amplifier which can lead to further advantages.

In operation, the current-to-voltage signal converter 40, performs the method of converting a current signal to a voltage signal. The method can comprise at least the three steps described above in reference to the current-to-voltage converter 20 and the current-to-voltage converter 30. The method has the same advantages and benefits as stated previously with regards to the current-to-voltage converter 20 and the current-to-voltage converter 30.

Figure 6:
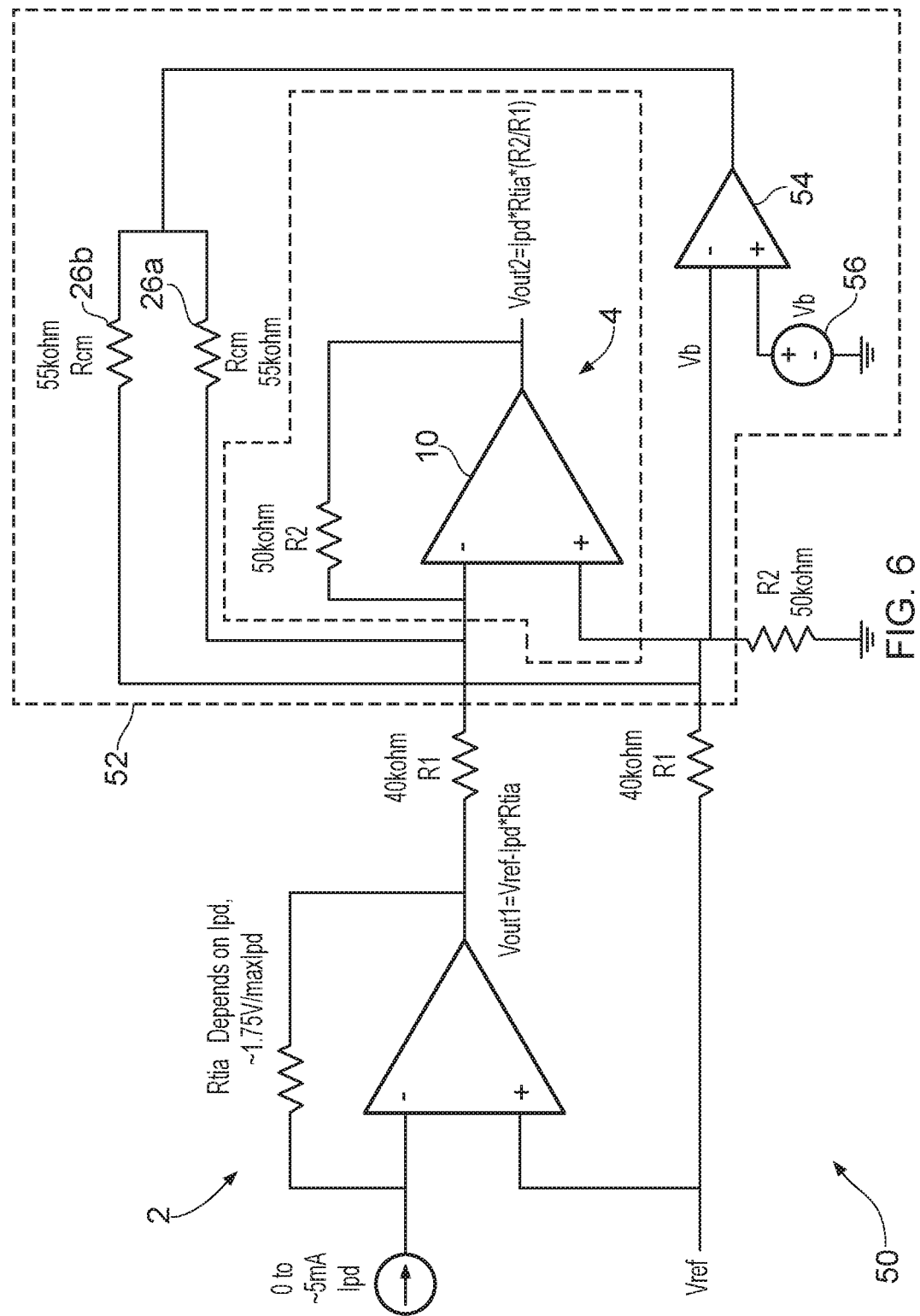
FIG. 6 illustrates a circuit diagram of a current-to-voltage signal converter with a feedback voltage adjustment arrangement with an op-amp.

FIG. 6 illustrates a current-to-voltage signal converter 50 comprising the structure of the current-to-voltage signal converter 1 (i.e. a trans-impedance amplifier 2 and an analog subtractor circuit 4) as illustrated in FIG. 1 with the addition of a voltage adjustment arrangement 52.

The current-to-voltage signal converter 50 operates in much the same way as the current-to-voltage converter 30 of FIG. 3 with at least all of the same advantages. The difference to FIG. 3 is that the NMOS transistor 36 has been replaced with a third op-amp 54 with a bias voltage (Vb).

The inverting input of the third op-amp 54 is electrically connected to non-inverting input of the second op-amp 10. The non-inverting input of the third op-amp 54 is electrically connected to the bias voltage (Vb) which performs the same purpose as the threshold voltage (Vth) of the NMOS transistor 36. That is, it results in the signal of interest (i.e. Ipd*Rtia) varying around the biased DC voltage signal (i.e. Vb). This can result in an effective shifting or scaling, or at least stabilisation, of the varying DC offset voltage (i.e. Vref) of the first voltage signal (Vout1). It is worth noting that the output of the third op-amp 54 can act as the first reference source, hence a common mode voltage/current source (similar to the common mode current source 34 of FIG. 3) can be absent. The third op-amp 54 can be electrically coupled to the first terminal of the first common mode resistor 26a and a first terminal of a second common mode resistor 26b.

Figure 7:
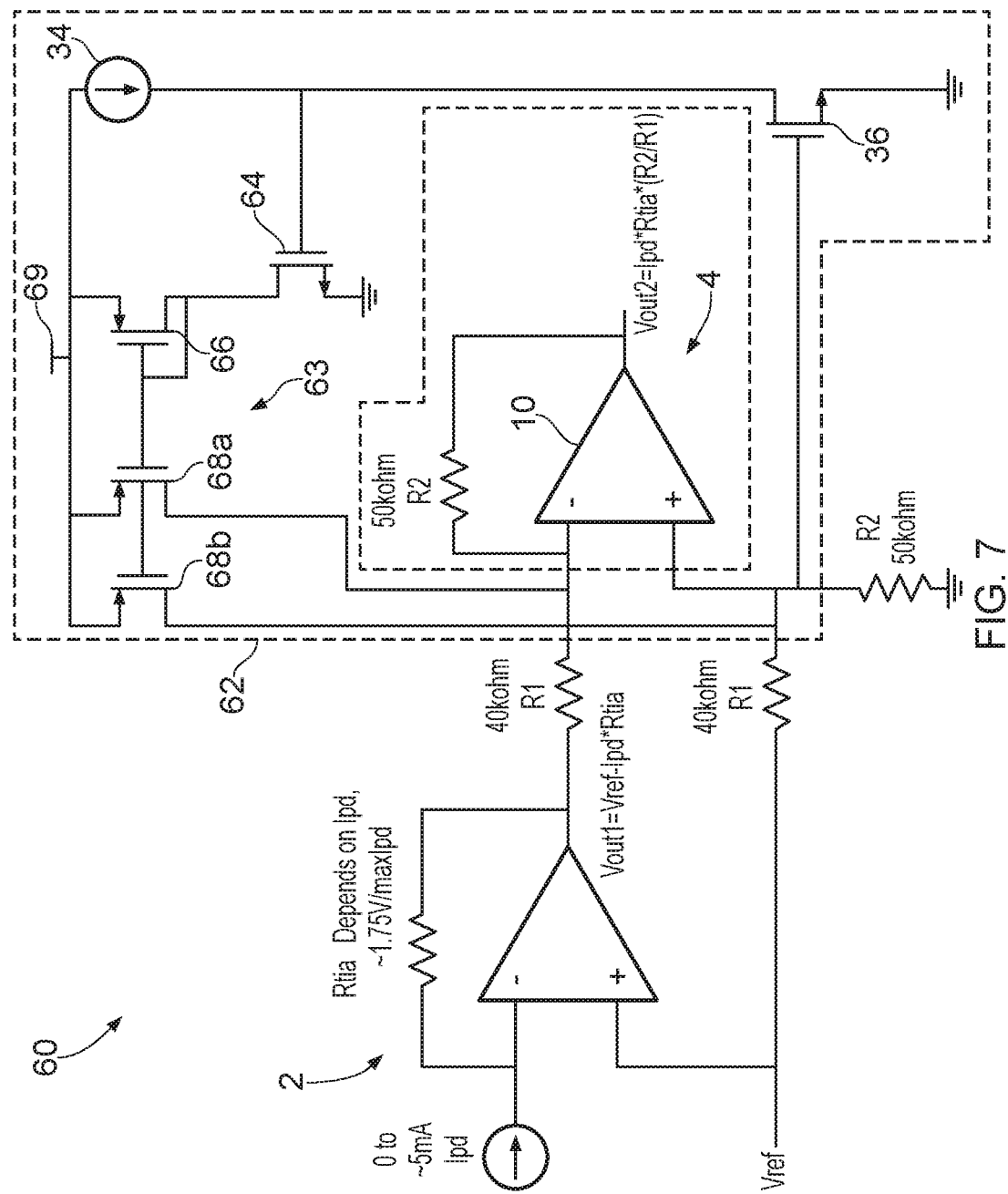
FIG. 7 illustrates a circuit diagram of a current-to-voltage signal converter with a feedback voltage adjustment arrangement with a current mirror arrangement.

FIG. 7 illustrates a current-to-voltage signal converter 60 comprising the structure of the current-to-voltage signal converter 1 (i.e. a trans-impedance amplifier 2 and an analog subtractor circuit 4) as illustrated in FIG. 1 with the addition of a voltage adjustment arrangement 62.

The current-to-voltage signal converter 60 operates in much the same way as the current-to-voltage converter 30 of FIG. 3 with at least all of the same advantages. The difference to the current-to-voltage converter 30 of FIG. 3 is that the first and second common mode resistors 26a, 26b have been replaced with a current mirror arrangement 63. The current mirror arrangement comprises a control (PMOS) transistor 66 and two mirrored (PMOS) transistors 68a, 68b. The drain of each mirrored transistor 68a, 68b are electrically coupled to the inverting and non-inverting inputs of the second op-amp 10 respectively. The source of each mirrored transistor 68a, 68b and control transistor 66, are connected together and to a power source 69. The gate of each mirrored transistor 68a, 68b, gate of the control transistor 66, drain of the second NMOS transistor 64, and the drain of the control transistor 66, are connected together. The source of the second NMOS transistor 64 is electrically coupled to electrical ground.

The drain of the feedback NMOS transistor 36 is electrically coupled to the common mode current source 34, and to the gate of a second NMOS transistor 64. The feedback NMOS transistor 36 can therefore, control the current flow through the second NMOS transistor 64. The second NMOS transistor 64 can therefore control the current in the current mirror arrangement 63. The mirrored current drawn by the two mirrored transistors 68a, 68b controls the voltage at the inverting and non-inverting inputs of the second op-amp 10 similarly to the pair of resistors 26a, 26b of FIGS. 2,3, and 5. Put another way, the two mirrored (PMOS) transistors 68a, 68b can aid in an effective shifting, scaling, and/or at least stabilisation of the varying DC offset voltage (i.e. Vref) of the first voltage signal (Vout1). This can enable the second op-amp 10 to be a low voltage op-amp and/or supplied by a unipolar supply voltage. This can improve system performance (accuracy, power efficiency) and reduce cost of the system (reduced surface area and size).

In a current-to-voltage signal converter 30, 40, 60 which can comprise a voltage adjustment arrangement 32, 42, 62 with a closed loop system and an NMOS transistor 36, the NMOS transistor 36 can be changed to a resistor arrangement or other simple amplifier. It is only useful to have amplifier functionality. Moreover, in the current-to-voltage signal converters 30, 40, 50, 60 any mosfet type transistors may be changed for BJT type transistors or any other transistor type without deviating from the concept described within this description.

For all of the above designs and circuits, it is possible to add an extra diode from the non-inverting input of the second op-amp 10 to electrical ground (i.e. anode is connected to ground). This diode can protect at least one input of the second op-amp 10 such that the second op-amp 10 always operates within a safe range when the current-to-voltage signal converter 1, 20, 30, 40, 50, 60 is initially powered up or if the voltage adjustment arrangement 22, 32, 42, 52, 62 cannot change the input voltage to the second op-amp 10 immediately.

An analog subtractor circuit can be modified with a feedback circuit so that the second op-amp does not 'see' a high voltage signal. The feedback circuit can have many different implementations and it can also be replaced with a feedforward circuit. To protect the low voltage amplifier from this circuit suddenly failing, a passive protection circuit can be used.

General

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to."

The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

It is to be understood that one or more features from one or more of the above-described embodiments may be combined with one or more features of one or more other ones of the above-described embodiments, so as to form further embodiments which are within the scope of the appended claims.

The invention claimed is:

1. A current-to-voltage signal converter, comprising:
    a first stage, configured to convert an input current signal to a first voltage signal;
    an analog subtractor circuit comprising an amplifier, wherein the analog subtractor circuit is electrically coupled to the first stage to convert the first voltage signal into a second voltage signal; and
    a voltage adjustment arrangement, coupled to at least one input of the amplifier, and configured such that the voltage at the at least one input of the amplifier is between a first predetermined voltage threshold and a second predetermined voltage threshold; and
    wherein the voltage adjustment arrangement comprises a first reference source, coupled to the at least one input of the amplifier; and
    wherein the at least one input of the amplifier comprises a first input and a second input, and wherein a common mode reference is coupled to both the first input and the second input.

2. The current-to-voltage signal converter of claim 1, the common mode reference is a voltage or current source.

3. The current-to-voltage signal converter of claim 1, wherein the first predetermined voltage threshold is greater than the second predetermined voltage threshold, wherein the first voltage signal is at least partially above the first predetermined voltage threshold or at least partially below the second predetermined voltage threshold.

4. The current-to-voltage signal converter of claim 1, wherein the amplifier is a low voltage amplifier and operates in its linear region, and the amplifier has a predetermined input voltage range, and the first predetermined voltage threshold is less than or equal to an upper end of the predetermined input voltage range, and the second predetermined voltage threshold is greater than or equal to a lower end of the predetermined input voltage range.

5. The current-to-voltage signal converter of claim 1, wherein the first stage is configured to operate within a first supply voltage range, wherein the amplifier is an operational amplifier and is configured to operate within a second supply voltage range, and the first supply voltage range is greater than the second supply voltage range, and/or the amplifier is configured to be further powered by a unipolar supply voltage.

6. The current-to-voltage signal converter of claim 1, wherein the input current signal is generated by a photodiode biased by a first reference voltage;
    wherein the first stage is a trans-impedance amplifier comprising a voltage input and a current input, wherein the first reference voltage is electrically coupled to the voltage input and the input current signal is electrically coupled to the current input; and
    wherein the second voltage signal is suitable for supplying an Analog to Digital Converter.

7. The current-to-voltage signal converter of claim 1, wherein the common mode reference comprises a fixed voltage source electrically coupled to a first terminal of a first common mode resistor and a first terminal of a second common mode resistor, wherein the second terminals of the first and second common mode resistors are electrically coupled to the first and second inputs respectively, wherein the first and second common mode resistors have substantially a same value resistance.

8. The current-to-voltage signal converter of claim 6, wherein the first reference voltage has a predetermined value, and the common mode reference is a fixed voltage source having a predetermined voltage based on the predetermined value.

9. The current-to-voltage signal converter of claim 1, wherein the voltage adjustment arrangement comprises a feedback loop configured to adjust the voltage of both the first input and second input into the amplifier of the analog subtractor circuit, wherein the voltage adjustment arrangement comprises a feedback amplifier configured to receive the second input to the amplifier of the analog subtractor circuit.

10. The current-to-voltage signal converter of claim 9, wherein the feedback amplifier is electrically coupled to a first terminal of a first common mode resistor and to a first terminal of a second common mode resistor, wherein the second terminals of first and second common mode resistors are electrically coupled to the first and second input respectively, wherein the first and second common mode resistors have substantially the same value resistance.

11. The current-to-voltage signal converter of claim 9, wherein the feedback amplifier is configured to operate a current mirror arrangement comprising two mirrored transistors and a control transistor, wherein the feedback amplifier is arranged to control a current flow in the control transistor and the two mirrored transistors are electrically coupled to the first and second input respectively, wherein the two mirrored transistors are size matched.

12. A current-to-voltage signal converter, comprising:
    a first stage, configured to convert an input current signal to a first voltage signal;

an analog subtractor circuit comprising an amplifier, wherein the analog subtractor circuit is electrically coupled to the first stage to convert the first voltage signal into a second voltage signal; and a voltage adjustment arrangement, coupled to at least one input of the amplifier, and configured such that the voltage at the at least one input of the amplifier is between a first predetermined voltage threshold and a second predetermined voltage threshold; and wherein the analog subtractor circuit further comprises a first, second, third and fourth resistors;

wherein the first resistor is electrically coupled in series between the first input and the first voltage signal;

wherein the second resistor is electrically coupled to the first input and forms a negative feedback loop based on an output of the operational amplifier, wherein the output of the operational amplifier is the second voltage signal;

wherein the third resistor and the fourth resistor form a potential divider such that the third resistor is electrically coupled in series between the second input and a first reference voltage, and the fourth resistor is electrically coupled to a ground state; and, wherein the first and third resistors have substantially the same value resistance and the second and fourth resistors have substantially the same value resistance.

13. A transimpedance amplifier, comprising:
a current-to-voltage converter, configured to receive a first current signal, and to generate a positive voltage output;
a voltage adjustment arrangement, coupled to the current-to-voltage converter, and configured to enable at least part of the current-to-voltage converter to operate between a first predetermined voltage threshold and a second predetermined voltage threshold, wherein the voltage adjustment arrangement comprises a feedback amplifier arranged to actively control the voltage adjustment based on the positive voltage output.

14. The transimpedance amplifier of claim 13, wherein the voltage adjustment arrangement comprises a constant voltage/current source coupled to a first terminal of a resistor, and a second terminal of the resistor is coupled to the current-to-voltage converter.

15. A method of converting a current signal to a voltage signal, the method comprising:
converting an input current signal to a first voltage signal using a first stage of a signal converter;
converting the first voltage signal into a second voltage signal using an analog subtractor circuit comprising an amplifier; and
applying a voltage adjustment arrangement to at least one input of the amplifier to reduce the voltage at the at least one input to the amplifier between a first predetermined voltage threshold and a second predetermined voltage threshold; and wherein the at least one input of the amplifier comprises a first input and a second input, wherein the voltage adjustment arrangement comprises a common mode reference coupled to both the first input and the second input, wherein the common mode reference is a DC source, and further performing acts of:
predetermining a DC offset voltage of the first voltage signal; and
predetermining a voltage or current value of the DC source based on the predetermined DC offset voltage.

16. A method of converting a current signal to a voltage signal, the method comprising:
converting an input current signal to a first voltage signal using a first stage of a signal converter;
converting the first voltage signal into a second voltage signal using an analog subtractor circuit comprising an amplifier;
applying a voltage adjustment arrangement to at least one input of the amplifier to reduce the voltage at the at least one input to the amplifier between a first predetermined voltage threshold and a second predetermined voltage threshold; and wherein the at least one input of the amplifier comprises a first input and a second input, wherein the voltage adjustment arrangement comprises a common mode reference coupled to both the first input and the second input, wherein the common mode reference is a DC source, and further performing acts of:
adjusting a voltage or current value at both the first input and the second input based on a DC offset voltage of the first voltage signal.

17. A current-to-voltage signal converter device, comprising:
a first stage, configured to convert an analog input current signal to a first voltage signal;
an analog subtractor circuit comprising an amplifier, wherein the analog subtractor circuit is electrically coupled to the first stage to convert the first voltage signal into an analog second voltage signal representative of the analog input current signal suitable for coupling to an input of an analog-to-digital converter; and
an analog level-shifter voltage adjustment arrangement, coupled to at least one input of the amplifier, and configured such that the voltage at the at least one input of the amplifier is between a first predetermined voltage threshold and a second predetermined voltage threshold.

18. The device of claim 17, wherein the analog level-shifter voltage adjustment arrangement is coupled to at least one input of the amplifier of the analog subtractor circuit to provide a common-mode input voltage adjustment to the amplifier of the analog subtractor circuit.

* * * * *